(12) United States Patent
Redon

(10) Patent No.: US 7,796,428 B2
(45) Date of Patent: Sep. 14, 2010

(54) THERMALLY ASSISTED MAGNETIC WRITE MEMORY

(75) Inventor: Olivier Redon, Seyssinet-Pariset (FR)

(73) Assignee: Commissariat a l'Energie Atomique, Paris (FR)

( * ) Notice: Subject to any disclaimer, the term of this patent is extended or adjusted under 35 U.S.C. 154(b) by 142 days.

(21) Appl. No.: 12/327,026

(22) Filed: Dec. 3, 2008

(65) Prior Publication Data
US 2009/0161424 A1     Jun. 25, 2009

(30) Foreign Application Priority Data

Dec. 21, 2007   (FR) .................................. 07 60303

(51) Int. Cl.
*G11C 11/14* (2006.01)
(52) U.S. Cl. ...................... 365/171; 365/158
(58) Field of Classification Search ................. 365/171, 365/158
See application file for complete search history.

(56) References Cited

U.S. PATENT DOCUMENTS

| | | | |
|---|---|---|---|
| 4,949,039 A | 8/1990 | Grünberg | |
| 5,159,513 A | 10/1992 | Dieny et al. | |
| 5,343,422 A | 8/1994 | Kung et al. | |
| 5,583,725 A | 12/1996 | Coffey et al. | |
| 5,640,343 A | 6/1997 | Gallagher et al. | |
| 5,953,248 A | 9/1999 | Chen et al. | |
| 6,021,065 A | 2/2000 | Daughton et al. | |
| 7,477,539 B2 * | 1/2009 | Kim et al. | 365/158 |
| 7,480,173 B2 * | 1/2009 | Guo et al. | 365/158 |
| 7,483,295 B2 * | 1/2009 | Guo et al. | 365/171 |
| 7,486,545 B2 * | 2/2009 | Min et al. | 365/158 |
| 7,486,550 B2 * | 2/2009 | Banerjee et al. | 365/173 |
| 2005/0002230 A1 | 1/2005 | Hosotani | |

FOREIGN PATENT DOCUMENTS

EP       1 653 516 A2     5/2006

OTHER PUBLICATIONS

J.M. Daughton, "*Magnetic Tunneling Applied to Memory (Invited)*," J. Applied Physics, vol. 81, No. 8, 1997, pp. 3758-3763.

* cited by examiner

*Primary Examiner*—Michael T Tran
(74) *Attorney, Agent, or Firm*—Burr & Brown

(57) ABSTRACT

A thermally assisted magnetic write memory including of memory points or memory cells, each of which includes a double magnetic tunnel junction separated from one another by a layer made from an antiferromagnetic material, and whereof the stacking order of the layers constituting them is reversed with regard to one another. Each of the magnetic tunnel junctions includes a reference layer, a storage layer, an insulating layer inserted between the reference and storage layers, constituting the tunnel barrier of the magnetic tunnel junction concerned. The blocking temperature of the layer is lower than the blocking temperature of the reference layer of the corresponding magnetic tunnel junction. The product RA resistance×area of the two tunnel barriers is different. Each memory point a way to heat the storage layers to a temperature above the blocking temperature of the layers.

15 Claims, 4 Drawing Sheets

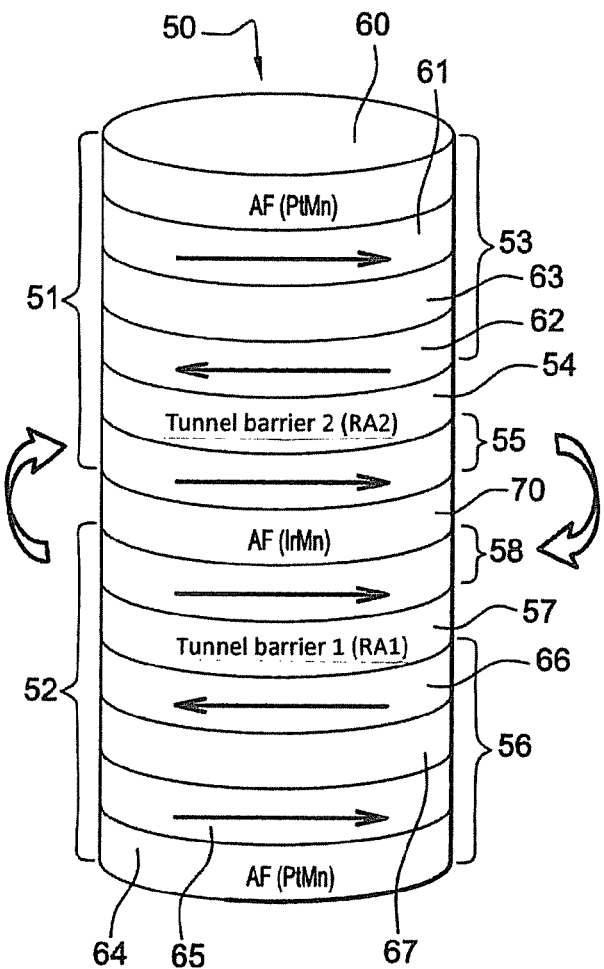
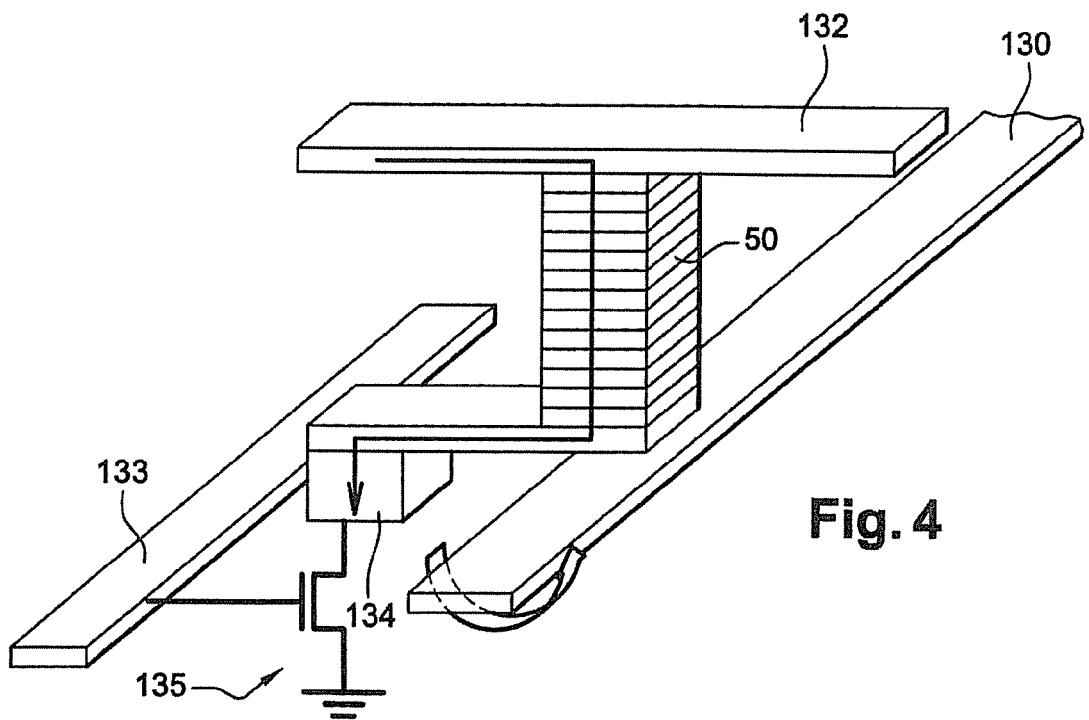

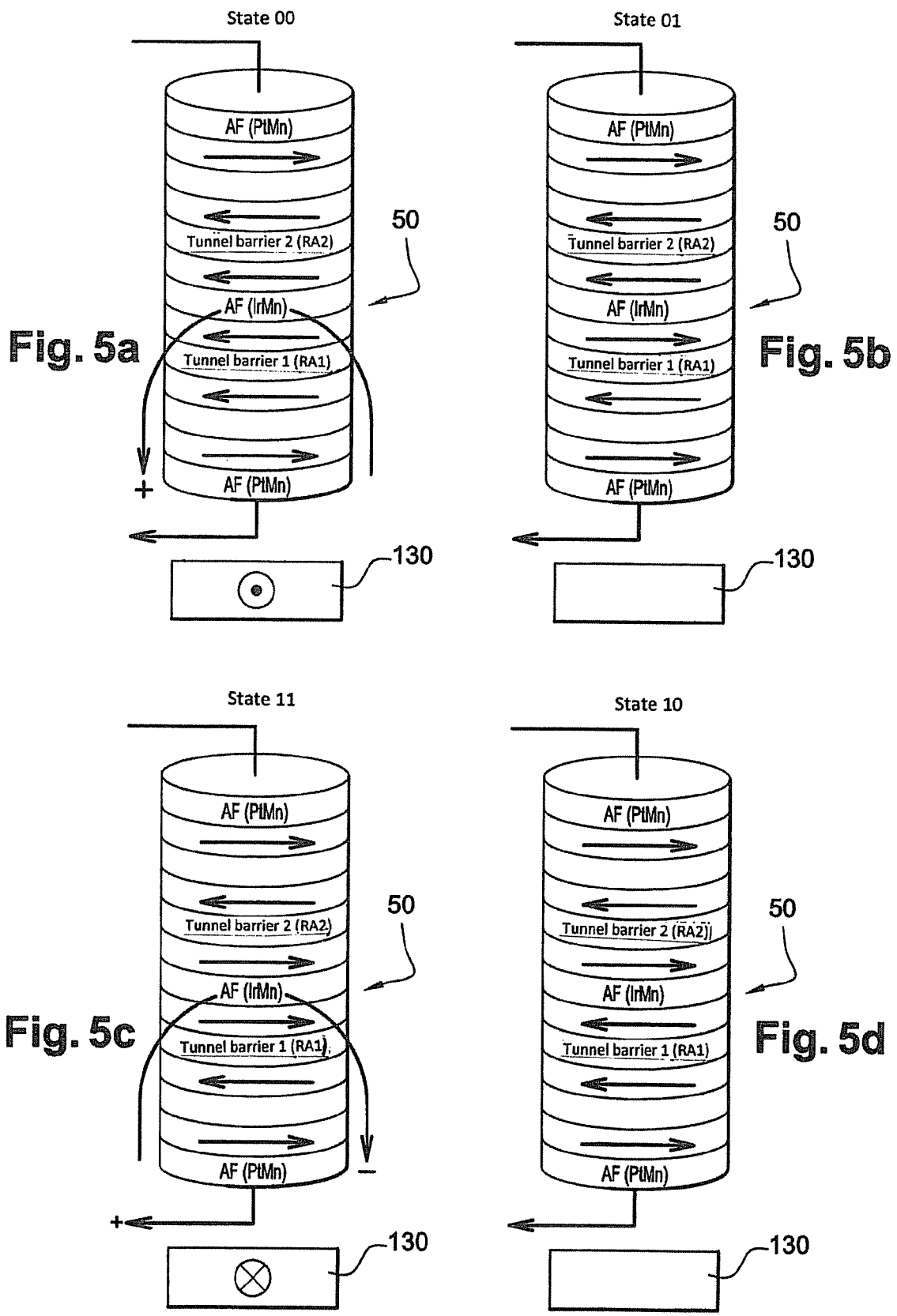

| States to write | << 00 >> | << 01 >> | << 10 >> | << 11 >> |
|---|---|---|---|---|
| Action | - Heating<br>- H+<br>- Cool with H+ | - Heating<br>- H+<br>- Cool without H+ | - Heating<br>- H-<br>- Cool without H- | - Heating<br>- H-<br>- Cool with H- |
Fig. 6
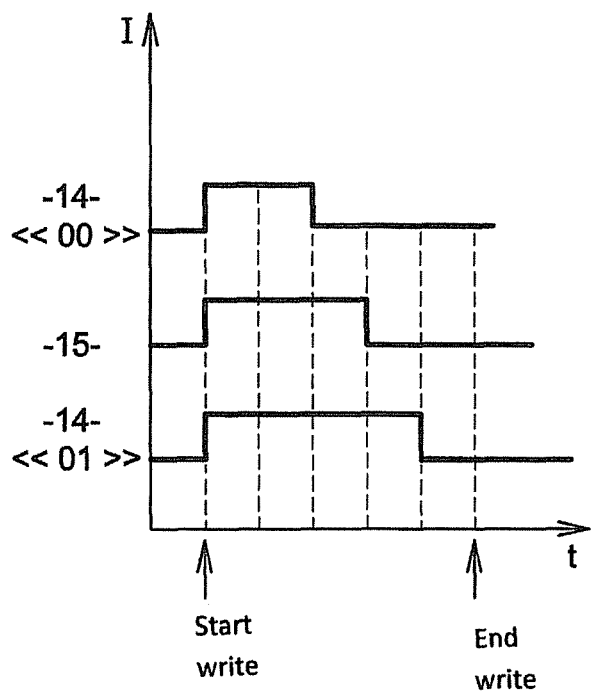
Fig. 7A
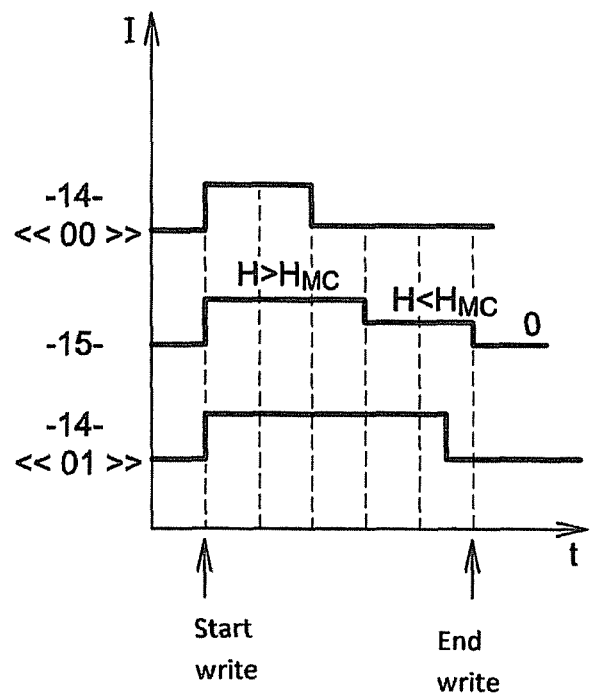
Fig. 7B

THERMALLY ASSISTED MAGNETIC WRITE MEMORY

FIELD OF THE INVENTION

The present invention relates to the technical field of magnetic memories, and more particularly to nonvolatile random access magnetic memories, for permitting in a manner known per se, the storage, reading, and writing of data in electronic systems.

The invention also relates to a method for thermomagnetic writing in such a device.

The invention finds its application in electronics and more particularly in the production of memory points for MRAM type memories (for the acronym "Magnetic Random Access Memory").

PRIOR ART

Interest in MRAM magnetic memories has been revived with the development of magnetic tunnel junctions (MTJ) having a high magnetoresistance at ambient temperature. These magnetic random access memories in fact have many advantages:
  speed close to that of SRAM (a few nanoseconds of write and read time),
  density close to that of DRAM,
  nonvolatility, like flash memories,
  absence of read and write fatigue,
  unaffected by ionizing radiation, an increasingly acute problem due to the reduction of the dimensions of elementary transistors.

In doing so, they are suitable for replacing the various memories of more conventional technology by combining the best properties of each, and thereby becoming a universal memory.

The first magnetic memories produced consisted of a set of memory points or memory cells, each comprising an element called "giant magnetoresistance element", formed from a stack of several alternately magnetic and nonmagnetic metal layers.

This type of structure has been described for example in documents U.S. Pat. No. 4,949,039 and U.S. Pat. No. 5,159,513 for the basic structures, and in document U.S. Pat. No. 5,343,422 for the production of an RAM memory from such basic structures.

This technology, by virtue of its architecture, allows the production of nonvolatile memories with a simple technology, but yet with limited capacity. This is because the fact that the memory elements or memory points are connected in series along each line, limits the possibility of integration, because the signal is increasingly weak as the number of memory elements or points increases.

The development of magnetic tunnel junction (MTJ) memory points has allowed a significant increase in the performance and the operating mode of these memories. Such magnetic tunnel junction magnetic memories have been described for example in document U.S. Pat. No. 5,640,343. In their simplest forms, they comprise two magnetic layers with different coercivities, separated by a thin insulating layer.

The first write modes proposed for this type of memory were based on a switching of the magnetization of one of the two magnetic layers, by superimposition of two orthogonal magnetic fields. The Stoner-Wolfarth type writings are used in the "FIMS" family (Field Induced Magnetic Switching, that is, switching of the magnetization by an induced magnetic field), and are for example described in document U.S. Pat. No. 6,021,065 and in the publication "*Journal of Applied Physics*" vol. 81, 1997, page 3758. According to this architecture, the memory cell must allow the production of two orthogonal magnetic fields. FIG. 1 shows such an architecture for a Stoner-Wolfarth type of writing.

As may be observed in this figure, each memory element or memory point (10) consists of the combination of a CMOS technology transistor (12) and an MTJ magnetic tunnel junction (11). Said tunnel junction (11) comprises at least one magnetic layer (20), called "storage layer" or "free layer", a thin insulating layer (21), and a magnetic layer (22) called "pinned layer", also called "reference layer".

Preferably, but yet in a nonlimiting manner, the two magnetic layers are made on the basis of 3d metals (Fe, Co, Ni) and their alloys, and the insulating layers conventionally consist of alumina ($Al_2O_3$), or even magnesium oxide (MgO). Advantageously, the magnetic layer (22) is coupled with an antiferromagnetic layer (23), whose function is to pin the layer (22), so that its magnetization is not switched during the write phases.

Advantageously, the pinned layer (22) may itself consist of several layers, as described for example in document U.S. Pat. No. 5,583,725, in order to constitute a layer called "synthetic antiferromagnetic" layer (SAF).

The operation of these magnetic cells, each consisting of a magnetic tunnel junction, consists, in particular for writing, in generating two pulse magnetic fields created by current lines or conductors associated with each of said tunnel junctions.

Thus, and in the context of the FIMS type architecture, three levels of addressing lines are observed. In FIG. 1, the two line levels (14) (bit line) and (15) (digit line), generally placed at 90° to one another, are therefore intended to generate magnetic field pulses for switching the magnetization of the free layer (20) during the write process. These magnetic field pulses are produced by circulating short electrical pulses, typically 2 to 50 nanoseconds, and with a strength of about a few milliamperes, in the current lines (14) and (15). The strength of these pulses and their synchronization are adjusted, so that only the magnetization of the memory point located at the intersection of these two current lines is susceptible to switching.

An additional addressing line level (16), also called "word line" is intended to command the opening or closing of the channel of the selection or switching transistors (12) associated with each memory point, in order to address each memory element individually in read mode. In other words, the CMOS transistors (12) are used as switches.

In write mode of the memory point concerned, the transistor (12) selected is in blocked or OFF mode, and no current therefore passes through the transistor. A current pulse I is sent into the two current lines (14) and (15) corresponding to the memory point (10) selected. The amplitude of the current pulse I is such that the magnetic field created is not sufficient to switch the memory points on the lines (14) or (15), except at the intersection of the lines (14) and (15) where the joint contribution of the two lines is sufficient to generate a magnetic field capable of switching the magnetization of the layer (20) of the memory point concerned.

In read mode, the transistor (12) is in saturated or ON mode by the sending of a positive voltage pulse into the grid of said transistor via the control line (16). A measurement current is then sent into the current line (14) which can only pass through the memory point of which the transistor (12) is placed in saturated or ON mode. With this current, a measurement is taken of the resistance of the magnetic tunnel junction (11) of said selected memory point (10). By comparison with a reference memory point (not shown), the corresponding state of the memory point (10) "0" or "1" can then be determined.

It may be understood from the above that the strength of the pulses passing through the current lines (14) and (15) and their synchronization are adjusted so that only the magnetization of the memory point lying at the intersection of these two current lines (selected point) can switch under the effect of the magnetic field generated by the two conductors. The other memory points located on the same line or on the same column (semi-selected points) are accordingly subject only to the magnetic field of one of the conductors (14, 15) and in consequence are not switched.

Owing to the write mechanism of these memory points, it is possible to understand the limits of this architecture. Insofar as the writing is provided by an induced magnetic field, the current strengths are subject to the value of the individual switching field of each memory point. Since the distribution function of the switching fields for all the memory points is wide (in fact, it is not uniform due to manufacturing limitations and intrinsic statistical fluctuations), it is necessary for the magnetic field on the selected memory point to be higher than the highest switching point of the distribution, at the risk of accidentally switching certain memory points located on the corresponding line or column, where the switching field, located in the lower part of this distribution, is lower than the magnetic field generated by the line or column alone. Furthermore, the electric power consumption of the memory using such an external magnetic field is commensurately greater as the switching field distribution is wider.

Moreover, since in general, the average value of the switching field increases as the size of the memory points decreases, which tends to occur, a commensurately higher current is expected in the future product generations. In consequence, the electric power required for the operation of these memories will be commensurately higher with greater integration.

Another drawback of these memories of the prior art concerns the stability of the magnetization of the free layer with regard to the thermal fluctuations when the size of the memory point decreases. In fact, the energy barrier to be crossed to switch the magnetization of this layer from one orientation to the other is proportional to the volume of this layer. As the volume decreases, the height of the barrier becomes comparable to the thermal agitation. The data written in the memory is then no longer stored. To overcome this difficulty, it is necessary to increase the magnetic anisotropy of the free layer by selecting a material having a higher anisotropy or by accentuating the shape anisotropy of the memory point, for example. But in doing so, the magnetic field required for magnetic switching increases, leading to higher electric power consumption to generate the field necessary for magnetic switching. Thus, it has been proposed to use thermally assisted magnetic random access memories, called TA-MRAM (for "thermally assisted MRAM"), in which the free layer is itself pinned by an antiferromagnetic layer. This improvement is described for example in document U.S. Pat. No. 6,385,082.

FIG. 2 shows a TA-MRAM type memory cell. In the cell, the free layer (41) of the magnetic tunnel junction (31) is pinned by an antiferromagnetic layer (40). Similarly to the case of FIMS type cells, an insulating layer (42) is included between the magnetic free layer (41) and a magnetic layer (43) called "pinned layer". In this configuration, the two magnetic layers are advantageously prepared from 3d transition metals (Fe, Co, Ni) and their alloys, doped or not (particularly with boron), and the insulating layer may be made from alumina or magnesium oxide. In an advantageous version, the pinned magnetic layer (43) is coupled with an antiferromagnetic layer (44), whose function is to pin the layer (43) so that its magnetization is not switched during the writing.

Here also, the reference layer (43) may be a synthetic antiferromagnetic layer consisting of several layers.

In this configuration, the antiferromagnetic layer (40) has a characteristic temperature called "blocking" temperature $T_B$ above which the stabilizing magnetic field called "exchange" field that it exerts on the free layer (41) is no longer effective. The material constituting the antiferromagnetic layer (40) and its thickness are selected so that the blocking temperature $T_B$ is higher than the operating temperature of the memory (operating temperature at rest). Similarly, the blocking temperature $T_B$ of the antiferromagnetic layer (40) is selected so that it is lower than and fairly distant from the blocking temperature of the antiferromagnetic layer (44) adjacent to the pinned layer (43).

Thus, at a temperature lower than the blocking temperature of the antiferromagnetic layer (40), the free layer (41) is stabilized by the exchange magnetic field, so that it proves to be very difficult to switch by the simple application of an external magnetic field. At the blocking temperature of the antiferromagnetic layer (40) and above this temperature, since the exchange field is zero, the free layer (41) then becomes very easy to switch by means of an external magnetic field, provided that the latter is higher than the coercive field of the free layer (41) at the given temperature. Accordingly, the materials selected for the free layer (41) should enable said layer to have a weak coercive field.

This particular architecture also comprises three addressing line levels. In this configuration, the current line (30) called "digit line", is located under the magnetic tunnel junction (31) but without being in contact with it. It is intended to generate the magnetic field required to switch the free storage layer (41), when an electric current of a few microamperes passes through it. Perpendicular to this digit line (30), the bit line (32) is located above the magnetic tunnel junction (31) of the memory point concerned and in contact with it. This bit line is intended to convey the heating current into the tunnel junction concerned. A third addressing line (33) called "word line" serves to switch the selection transistor (35) to ON or OFF mode. Similarly as for FIMS, the word line commands the opening or closing of the channel of the transistors over its whole length by the application or not of a control voltage, each of the transistors operating in switching mode for each of the associated memory points.

In read mode, the CMOS transistor (35), associated with the memory point to be read, is closed by the application of an adequate voltage in the word line (33). The read principle remains identical to the one described in relation to a FIMS type cell.

In write mode, the CMOS transistor (35) of the memory point to be read is closed by means of the application of an adequate voltage in the word line (33). A heating current pulse is then sent into the memory point to be written by the bit line (32). When the current density j flowing in the tunnel junction (31) is sufficient, the power density generated $P=RA \cdot j^2$ (where RA is the product of the resistance of the tunnel junction and its area A) allows an increase in the temperature in said tunnel junction above the blocking temperature $T_B$ of the antiferromagnetic layer (40) in contact with the storage layer (41). The exchange field stabilizing the free layer (41) then becomes zero, and the latter is then very mobile. An electric pulse of a few hundred microamperes for a few nanoseconds is then sent into the digit line (30) once the blocking temperature is reached (after a few nanoseconds), and generates a sufficient magnetic field to switch, in the right direction (writing of bit "1" or "0"), the free layer (41) which, as already stated, is very mobile at this precise moment, with a weak intrinsic coercivity. Once the free layer (41) has been written, the heating current in the magnetic tunnel junction (31) is interrupted (by cutting off the current in the bit line (32) and opening the transistor (35)). The overall temperature of the memory point then drops very rapidly (a few nanoseconds) below the blocking temperature of the antiferromagnetic layer (40) (typically at the operating temperature at rest), and the exchange field then resumes its initial value, automatically stabilizing the free layer (41). The electric current in the digit line (30) is then cut off in turn.

A problem of electricity consumption occurs in a large number of magnetic random access memories, particularly when a write magnetic field is generated using one or more field lines, whether for the FIMS and the TA-MRAM described above, or for the "toggle switch" memory described for example in document U.S. Pat. No. 6,549,906.

It is known that the use of a storage layer coupled with an antiferromagnetic layer serves to obtain the storage of the multibit data.

In fact, with the magnetic tunnel junctions of the prior art, a memory point has two possible states, corresponding to the two parallel and antiparallel magnetic configurations, the latter corresponding respectively to parallel and antiparallel alignments of the magnetization of the storage layer with regard to that of the reference layer.

These bistable systems are obtained by imparting to the storage layer a magnetic anisotropy of magnetocrystalline origin or of shape (memory points, for example of elliptical shape), with an easy magnetization axis parallel to the magnetization of the reference layer. To orient the magnetization of the storage layer in any intermediate direction between the parallel direction and the antiparallel direction to the magnetization of the reference layer, the storage layer and the adjacent antiferromagnetic layer are heated above the blocking temperature by sending a current pulse through the magnetic tunnel junction, and the magnetization of the storage layer is then oriented in the desired direction during the cooling of the antiferromagnetic layer. In order to obtain the desired orientation for the magnetization of the storage layer, a local magnetic field is applied thereto in the desired direction. For this purpose, the magnetic switching is obtained by sending current pulses into perpendicular current lines respectively located above and below the memory point concerned. In doing so, magnetic fields can be generated in two perpendicular directions, and by adjusting the relative strength of the current flowing in the two current lines, a magnetic field can be generated in any planar direction, and preferably, in four directions oriented respectively with regard to the orientation of the magnetization of the reference layer at 0°, 70°, 110° and 180°, with the objective of optimizing the differences in resistance between these four states.

It is a first object of the present invention to propose a novel thermomagnetic write mode for multibit TA-MRAM.

It is a second object of the invention to propose a TA-MRAM cell with four states by using a single field line, and therefore employing an architecture identical to the one described with regard to FIG. 2.

It is a third object of the invention to propose a multibit TA-MRAM cell with low consumption thanks to the production of a single magnetic field.

It is a fourth object of the invention to propose a multibit A-MRAM cell having improved endurance.

It is a fifth object of the invention to propose a multibit TA-MRAM matrix architecture with a single field line, where the four states can be written in only two write phases.

SUMMARY OF THE INVENTION

This thermally assisted magnetic write memory consists of memory points or memory cells, each of which consists of a double magnetic tunnel junction separated from one another by a layer made from an antiferromagnetic material, and whereof the stacking order of the layers constituting them is reversed with regard to one another, each of the magnetic tunnel junctions comprising:
a magnetic reference layer, called "pinned layer" whereof the magnetization has a fixed direction;
a magnetic storage layer, called "free layer" whereof the magnetization direction is variable, and consists of one layer made from a ferromagnetic material having an in-plane magnetization of the layer, magnetically coupled by exchange with a pinning layer made from an antiferromagnetic material and consisting of the layer separating the two magnetic tunnel junctions;
an insulating layer inserted between the reference layer and the storage layer, constituting the tunnel barrier of the magnetic tunnel junction concerned.
According to the invention:
the blocking temperature of the antiferromagnetic pinning layer separating the two magnetic tunnel junctions is lower than the blocking temperature of the reference layer of the corresponding magnetic tunnel junction;
the product RA (resistance×area) of the two tunnel barriers is different;
each memory point comprises means for heating the storage layers to a temperature above the blocking temperature of said layers;
the memory comprises means for applying a magnetic field for orienting the magnetization of the storage layer or layers of each memory point with regard to the magnetization of the reference layer or layers without changing the orientation of the reference layers concerned;
the storage layers are coupled magnetostatically across the layer made from antiferromagnetic material separating said storage layers, so that the magnetizations of said layers are placed in an antiparallel configuration when the temperature in the magnetic tunnel junction concerned exceeds the blocking temperature of said layer of antiferromagnetic material and in the absence of a magnetic field applied to said memory, or under the influence of a magnetic field of lower intensity than the magnetostatic coupling between said storage layers.

In this way and using such a structure, it is possible to vary the dual combination of heating of the memory point on the one hand and the orientation of a magnetic field on the other to obtain four stable states of the memory point concerned, and within a compact size.

Advantageously, the product RA of one of the two tunnel barriers is substantially equal to half of the other. In doing so, the read separation of the various stable states of the memory point concerned is optimized.

According to another feature of the invention, the means for varying the orientation of the magnetic field of the storage layers consist of a single conductive line, located above or below the magnetic memory point concerned. In doing so, the architecture of the magnetic memory using such memory points is simplified.

In practice, the memory points have an elliptical or advantageously circular cross section.

In practice, the storage layers are made from a material based on an alloy of Fe, Co, Ni (CoFe or NiFe), which can be doped with boron, in particular when the tunnel barriers are made from MgO.

Moreover, the two storage layers are coupled magnetostatically through the pinning layer of an antiferromagnetic material that separates them. This magnetostatic coupling preferably orients the magnetizations of these storage layers in an antiparallel manner, in order to minimize the energy of the system. In order to control the magnetizations of the storage layers, the thicknesses of said layers are different.

According to the invention, the magnetization of each of the storage and reference layers is substantially parallel to the plane of said layers.

In practice, and according to the invention, the antiferromagnetic layers pinning the reference layers are prepared on the basis of a PtMn alloy, while the antiferromagnetic layer separating the two magnetic tunnel junctions is based on a manganese Mn rich alloy, having a lower blocking temperature than the PtMn alloy. In practice, this antiferromagnetic layer is based on IrMn or FeMn. In other words, the antiferromagnetic layers pinning the reference layers are prepared from a material of which the blocking temperature is higher (typically higher than 250° C.) than the blocking temperature (typically lower than 200° C.) of the antiferromagnetic layer separating the two magnetic tunnel junctions.

Each of the reference layers advantageously consists of a multilayer comprising two magnetic layers and an intermediate layer selected from a material that comprises ruthenium, the two magnetic layers located on either side of this intermediate layer being antiferromagnetically coupled by this said intermediate layer.

The invention also relates to a method for effecting the writing of such memory points of a magnetic memory.

According to the invention, each write phase is accompanied by an increase in temperature of the memory point concerned by the sending of a current pulse into a conductive line through the tunnel junction associated with the memory point concerned.

The writing according to the invention is effected in three phases:
- heating of the memory point by circulating a current in the conductive line (bit line) and then through the tunnel junction concerned to raise the temperature above the blocking temperature or ideally above the Néel temperature of the antiferromagnetic layer separating the two storage layers;
- transmission of a current pulse into the digit line, to obtain the alignment of the magnetizations of the storage layers parallel or antiparallel to the alignment of the magnetizations of the reference layers in contact with the tunnel barriers; the orientation of the magnetizations of the storage layers is defined by the positive or negative polarization of the current in the digit line (that is, by the orientation of the magnetic field created in one direction or in the opposite direction);
- definition of the states of the memory point during cooling:
- interruption of the heating current before the end of the current pulse in the digit line: definition of the states "00" and "11" according to the polarity of the current passing through the digit line;
- interruption of the heating current after the end of the current pulse in the digit line: creation of a magnetostatic coupling between the two storage layers, causing the switching of the magnetization of one of said two layers to favor an antiparallel alignment of the magnetizations, which is more stable from the energy standpoint. The states "01" and "10" are defined according to the polarity of the current in the digit line.

BRIEF DESCRIPTION OF THE FIGURES

The manner in which the invention can be implemented and the advantages thereof will appear more clearly from the exemplary embodiment that follows, provided for information and nonlimiting, in conjunction with the appended figures.

As already indicated.

FIG. 3 is a schematic representation of a memory point according to the invention.

FIG. 4 is a schematic perspective representation of a memory point of the invention, associated with its current lines suitable for its writing.

FIGS. 5A and 5D are schematic perspective representations illustrating a write method according to the invention, in order to obtain the four stable states of the memory point concerned.

FIG. 6 is a simplified representation to illustrate the write principle according to the invention.

FIGS. 7A and 7B illustrate a representative diagram of the variation in strength of the current passing through certain current lines as a function of time, according to another embodiment of the invention.

DETAILED DESCRIPTION OF THE INVENTION

Figure 1:
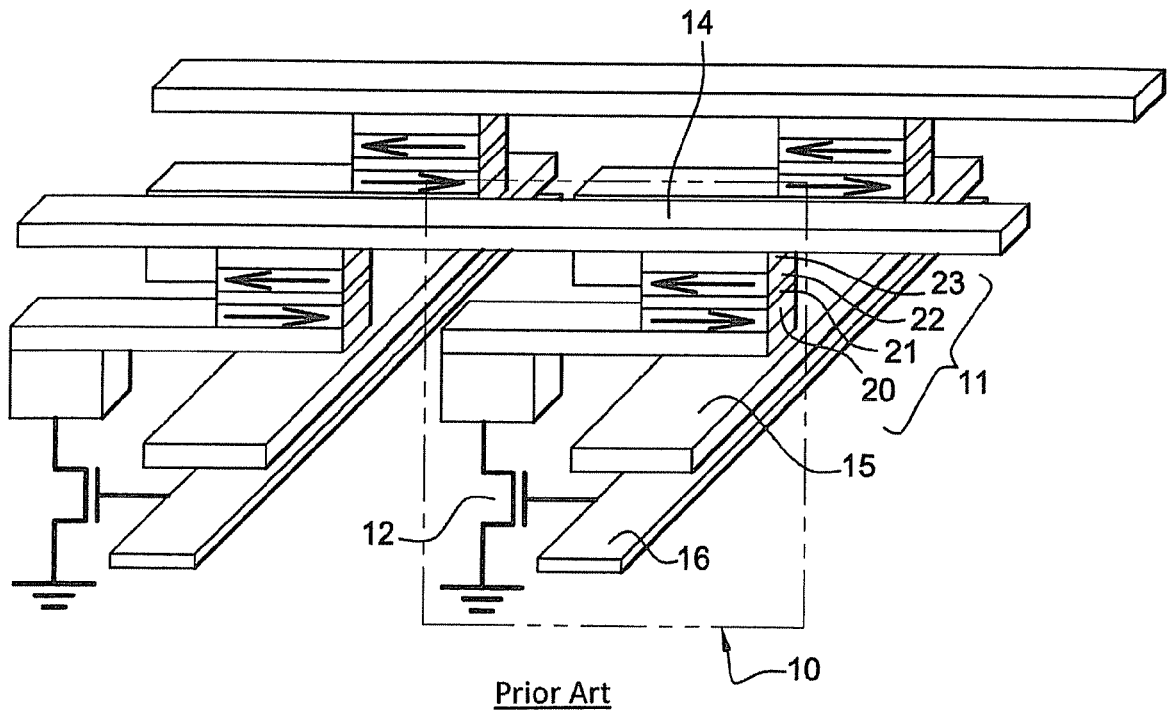
FIGS. 1 and 2 are schematic representations, respectively of the architecture of an FIMS type and TA-MRAM type magnetic memory according to the prior art.
Figure 2:
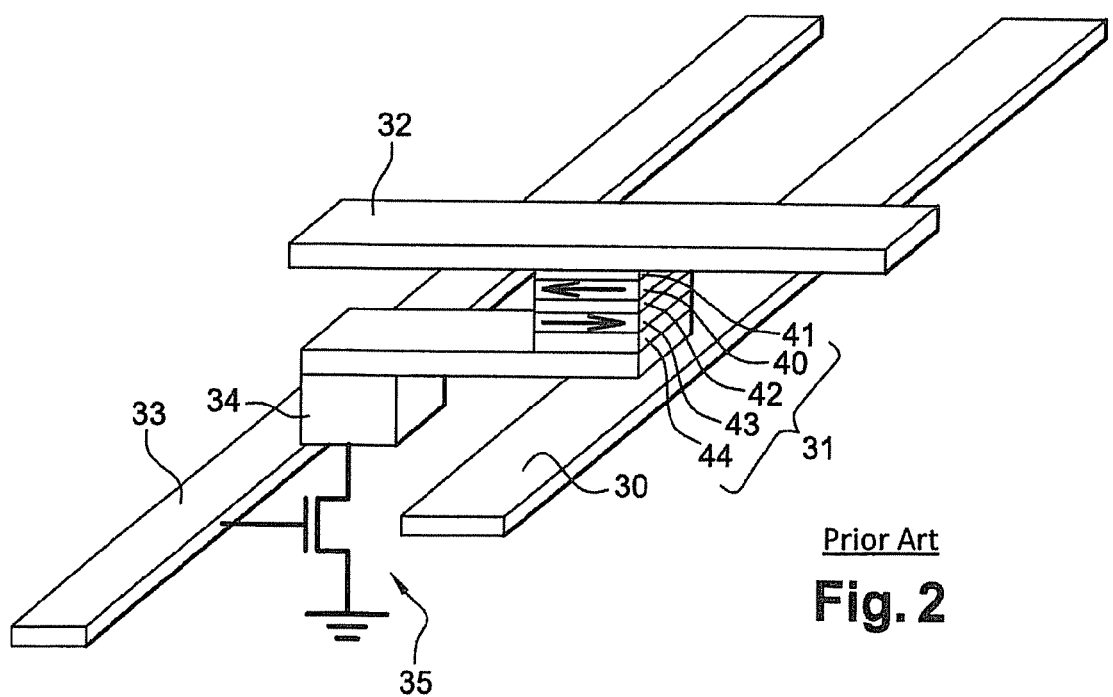

The magnetic memory according to the invention consists of a matrix of memory points or memory cells.

Each of these memory points (50), according to one feature of the invention, consists of two magnetic tunnel junctions (51, 52) separated from one another by a layer (70) made from an antiferromagnetic material, and in this case a layer of manganese rich alloy, such as IrMn or FeMn.

Each of these magnetic tunnel junctions (51, 52) consists of a stack of layers comprising a storage layer (55, 58), a tunnel barrier (54, 57) and a reference layer (53, 56).

It should be observed that the two magnetic tunnel junctions are mounted in reverse to one another, that is, the storage layer of each of them is in direct contact with a separating layer (70) of antiferromagnetic material IrMn, separating the two magnetic tunnel junctions, as already stated.

The magnetization of each of the layers, respectively the storage and reference layers, of the two magnetic tunnel junctions is located in the main plane containing said layers.

According to the invention, the materials of the storage and reference layers respectively are selected so that the decrease in temperature of the switching field of the storage layers is much faster than that of the switching field of the reference layers.

In other words, the material of the separation layer (70) is selected from antiferromagnetic material separating the storage layers (55, 58) so that its blocking temperature is significantly lower than that of the antiferromagnetic materials used in the reference layers (53, 56).

Thus, during the writing of the memory point concerned, it undergoes a brief heating up to a temperature that may typically reach 200° C., which has the effect of passing above the blocking temperature of the layer (70) of antiferromagnetic material which pins the magnetizations of the storage layers (55, 58). Since the exchange coupling is reduced to zero, the switching field of the storage layers reaches its minimum value when the temperature of the antiferromagnetic layer (70) reaches the Néel temperature of the material constituting it, which corresponds to the temperature at which the magnetic order, even at short distance, disappears.

The storage layers may consist of a monolayer of ferromagnetic material, typically consisting of cobalt, nickel or iron, or an alloy of these various elements. These alloys may further be doped with boron.

The reference layer (53, 56) of each of the magnetic tunnel junctions consists of a synthetic antiferromagnetic layer comprising a stack of two ferromagnetic layers, respectively (61, 62) and (65, 66) separated by a layer of amagnetic material, respectively (63) and (67). The ferromagnetic layers (61, 62) and (65, 66) are, for example, made from an alloy based on Fe, Co, and Ni, optionally doped with boron for the layers in contact with the tunnel barrier. The layer of amagnetic material is generally made from Ru or another "spacer" allowing a strong antiferromagnetic RKKY coupling.

On the side opposite their contact zone with the corresponding tunnel barrier, said reference layers are in contact with a layer of an antiferromagnetic material (60, 64), typically made from PtMn or another alloy having a high blocking temperature (above 280° C.).

The thickness of the magnetic layers constituting the storage layers is selected in order to favor an antiparallel alignment of the magnetizations when the storage layer is heated in the absence of any magnetic field.

The tunnel barriers (54, 57) are made from an insulating or semiconductor material, particularly of alumina or magnesium oxide MgO.

Each of these stacks is liable to undergo a short rise in temperature, in order to favor the switching of magnetization of the storage layer, in this case from a parallel state to an antiparallel state with regard to the reference layer with which it is coupled.

For this purpose, each of the memory points of the matrix is placed between an upper conductive line (132) called bit line and a switching transistor (135) associated with a control line (133), the latter, as already indicated, opening or closing the transistor concerned. Accordingly, by making the transistor of the memory point to be written conducting, and by sending a current pulse into the corresponding upper conductive line (132), this current pulse passes through the memory point concerned and causes its heating.

The lowering of the switching field associated with the local rise in temperature is much greater than the width of the switching field distribution at ambient temperature.

Accordingly, by sending a current pulse into a lower conductive line (130) called digit line, generating a magnetic field whereof the orientation depends on the direction of flow of said current pulse in the conductive line, during the cooling of the memory point addressed, only the magnetization of the storage layers of the junction concerned is switched.

According to the invention and in order to obtain the four stable write states desired, the following procedure is used, according to the various steps shown in FIGS. 5A to 5D:

1—Writing of State "00"

A current pulse is applied to heat the separation layer (70) of antiferromagnetic layer separating the storage layers above its blocking temperature, and preferably above its Néel temperature, the corresponding control transistor obviously being made conducting.

Simultaneously, a positive magnetic field is generated by causing the appropriate current to transit through the digit line (130) in order to align the magnetizations of the storage layers parallel to that of the reference layers in contact with the tunnel barrier.

In the context of the present invention, "positive magnetic field" means, by convention, the magnetic field viewed by the storage layers, whereof the orientation is parallel to the magnetization of the reference layers in contact with the tunnel barrier.

In the context of the present invention, "negative magnetic field" means, according to the same convention, the magnetic field viewed by the storage layers, whereof the orientation is antiparallel to the magnetization of the reference layers in contact with the tunnel barrier.

The heating current is then stopped and the structure is cooled while still being maintained under the influence of the abovementioned magnetic field, thereby ensuring the maintenance of the orientation of the magnetizations of the storage layers parallel to the direction of the magnetizations of the reference layers in contact with the tunnel barrier (FIG. 5A).

2—Writing to State "01"

As in the previous case, the tunnel junction is heated by circulating a current through the bit line (132). When the temperature exceeds the blocking temperature of the separation layer (70) of antiferromagnetic material separating the storage layers, and preferably exceeds its Néel temperature, the magnetizations of the storage layers are liberated, and may be switched by the application of a local magnetic field.

After heating, a current pulse is sent into the digit line (130) to generate a positive magnetic field (according to the convention previously described), in order to align the magnetizations of the storage layers parallel to the magnetization of the reference layers in contact with the tunnel barrier.

The current is stopped in the digit line, leading to the relaxation of the magnetization of said storage layers in their lowest energy configuration, that is, an antiparallel orientation. This configuration results from the magnetostatic coupling existing between the two ferromagnetic storage layers through the separation layer of antiferromagnetic material (70). Owing to the asymmetry arising from the difference in thickness of the ferromagnetic layers of the storage layers, it is possible to determine which storage layer remains aligned in its saturation direction, and which layer is oriented in the antiparallel direction.

In the example in FIG. 5B, the layer (55) is slightly thicker than the layer (58): it is therefore the layer which preserves its parallel oriented magnetization.

3—Writing of State "11"

The method is followed as the one described in relation to the writing of state "0", with the exception of the use of a negative magnetic field (according to the convention previously described). In doing so, an antiparallel alignment of the magnetization of the storage layers is generated with regard to that of the reference layers in contact with the tunnel barrier.

4—Writing of State "10"

The same method is followed as the one described in relation to the writing of state "01", with the exception of the use of a negative magnetic field, also according to the same convention.

It is known that in a magnetic memory, the resistance of the tunnel junction is given by the relative orientations of the magnetization of the magnetic layers located on either side of the tunnel barrier. When these orientations are parallel, the resistance RAp is low whereas the resistance is a maximum in an antiparallel configuration (RAap).

In the case of the present invention, the resistance of the various states can be defined as follows:

1) state "00": $R = RA_{1p} + RA_{2p}$ where $RA_1$ and $RA_2$ are the respective products of resistance×area of the two tunnel barriers.

2) state "01": $R = RA_{1ap} + RA_{2p}$ 3) state "10": $R = RA_{1p} + RA_{2ap}$
4) state "11": $R = RA_{1ap} + RA_{2ap}$ In order to have a substantially identical difference in resistance between each of the states, the resistance of the second tunnel barrier is selected to be half of the first, that is $RA_{2p} = 0.5 \times RA_{1p}$.

Since in a known manner, $RA_{1ap} = (1 + TMR) RA_{1p}$, where TMR is the tunnel magnetoresistance, we therefore obtain the respective resistances:

1) $R_{00} = 1.5\ RA_{1p}$
2) $R_{10} = 0.5(3 + TMR)\ RA_{1p}$
3) $R_{01} = (1.5 + TMR)\ RA_{1p}$
4) $R_{11} = 1.5(1 + TMR)\ RA_{1p}$

Thus, in this configuration, the distance in resistance between each of these states is equal to $0.5 \times TMR \times RA_{1p}$.

FIG. 6 shows the operating mode in the form of a write table of the point concerned, according to this embodiment.

Advantageously, and according to the invention, the cross section of the magnetic tunnel junctions is circular so that the aspect ratio AR equal to 1 (AR is the ratio of the lengths of the major axis to the minor axis of an ellipse), in order to minimize the shape anisotropy and hence the switching field of the magnetizations of the storage layers. However, during the write phases of the states "01" and "10", the relaxation of the magnetizations in an antiparallel configuration takes place at a temperature close to 200° C. without an applied magnetic field. In doing so, the system only has very little energy to maintain this stable configuration over time. The thermal stability of the system is only a few ns to a few tens of ns according to the volume of the storage layers.

A minimum diameter of the memory point can be defined for which the thermal stability is at least 10 ns, thereby allowing the relaxation in the antiparallel configuration (of which the duration is less than or equal to 3 ns) and a cooling which ensures the pinning of the magnetizations.

Thus, in the case of a magnetocrystalline anisotropy of Hk ~15 Oersted, a thickness of the storage layer of 3 nm, a stability $\tau = 10$ ns, a magnetization of the storage layer Ms = 1000 emu/cc, and a temperature T = 473 K, the minimum diameter can be determined by the equation:

$$D = \sqrt{\frac{4}{\pi}\left(\frac{2 \cdot K_B T \ln 10}{Ms \cdot Hk \cdot \tau}\right)}$$

leading to a diameter which must not be less than or equal to 90 nm.

If the diameter is lower than 90 nm, the thickness of the storage layer, either its magnetization or its anisotropy, must be increased by changing the type of material constituting it, or even, by using a product AR higher than 1.

The latter option is penalizing for the operation of the memory, because it causes an increase in the electric power consumption to levels close to that of a standard MRAM.

The system can also be stabilized by applying a magnetic field H via the digit line, of which the strength satisfies the equation $0 < H < H_{MS}$, where $H_{MS}$ is the magnetostatic coupling field between the storage layers.

According to an alternative of the invention, the structure previously described is placed between two materials of the thermal barrier type having low thermal conductivity, such as GeSbTe or BiTe for example, with a concern to reduce the current density required to heat the memory point. These materials play the role of a heat shield and block the heat produced inside the tunnel junctions.

Moreover, the multibit TA-MRAM cell described in the present invention can be placed in a matrix memory architecture, as shown in FIG. 1. In this configuration, the method for writing the various states is as follows:

In a first phase, the word line (16) is opened in order to place all the transistors (12) of the column concerned in ON mode.

Then, a heating current is sent into all the bit lines (14) in order to allow the writing of all the memory points of the column.

Subsequently, a current suitable for generating a positive magnetic field (according to the convention previously described) is sent into the digit line (15) to orient the magnetization of the storage layers parallel to the magnetization of the reference layers in contact with the tunnel barriers.

In order to write state "00", the heating in the memory point concerned is stopped by stopping the current in the bit line (14). Said memory point therefore cools under the action of the positive magnetic field generated by the digit line (15).

To write the state "01" in the column concerned, the magnetic field generated by the digit line (15) is stopped or decreased (particularly to a value lower than the magnetostatic coupling field between the two storage layers located on either side of the pinning layer of antiferromagnetic material), before cooling, that is, before interrupting the current in the bit line (14).

According to this embodiment, the states "01" are necessarily written after the states "00", because it is necessary to await this interruption of the current in the digit line (15).

FIGS. 7A and 7B show a diagram illustrating the variation in current in the bit line (14) and in the digit line (15) as a function of time, to write the states "00" and "01", in two alternatives of the invention, that is, by canceling the magnetic field generated by the digit line (15) (FIG. 7A) or by decreasing said field (FIG. 7B). The embodiment corresponding to FIG. 7B is more particularly required when the size of the memory point is smaller than or equal to 90 nm, in order to create a stabilizing field during the cooling. In fact, below 90 nm, the thermal fluctuations are liable to rapidly disorient the magnetizations of the storage layers.

The writing of the states "11" and "10" follows the same method as the one previously described, but by generating a negative magnetic field (according to the convention described) instead of a positive magnetic field.

The present invention procures a number of advantages, including the following:

the need for a single field line to write the multibit TA-MRAM cell, whereas the prior art cells require at least two. In doing so, the architecture is simplified and reduced to the conventional architecture of a TA-MRAM cell with two states. This technology is therefore directly installable in products using such cells, thereby serving to double the stored data density;

the consumption of such a cell is reduced in comparison with the prior art cells, insofar as only one magnetic field is generated. If we consider that a magnetic field must be applied to write each state, the reduction in consumption reaches about 20%. If moreover, it is acceptable to read the data before writing it, the reduction in consumption is close to 40%, insofar as certain transitions between states can take place without magnetic field. In fact, the transitions "00" to "01" and "11" to "10" only require heating (no field). Accordingly, in two cases out of the possible twelve, writing can be carried out without a field;

the breakdown endurance of the cell is improved in comparison with the prior art cells. In fact, it comprises a double tunnel barrier, and not a single tunnel barrier like the prior art cells. In doing so, the power density required to heat the antiferromagnetic pinning layer separating the storage layers of the invention is identical to that required for a cell having a single tunnel barrier, but the voltage viewed by each barrier is reduced. In fact, as a reminder, the power required is expressed by the equation $P=RA \cdot j^2$, where RA is the product of resistance×area, and j the current density. According to the present invention:

$$P=RA \cdot j^2=(RA_1+RA_2) \cdot j^2$$

It may be recalled that $RA_1=\frac{1}{2} RA_2$ and hence $RA_1=\frac{2}{3} RA$.

Thus, the voltage V at the terminals of the systems is written:

$$V=RA \cdot j=\frac{1}{3}RA \cdot j+\frac{2}{3}RA \cdot j=\frac{1}{3}V+\frac{2}{3}V.$$

In this way, the voltage on each tunnel barrier is reduced with a maximum of $\frac{2}{3}$ V.

The invention claimed is:

1. A thermally assisted magnetic write memory, consisting of memory points or memory cells, each of which consists of a double magnetic tunnel junction separated from one another by a layer made from an antiferromagnetic material, and whereof the stacking order of the layers constituting them is reversed with regard to one another, each of the magnetic tunnel junctions comprising:
   a magnetic reference layer called "pinned layer" whereof the magnetization has a fixed direction;
   a magnetic storage layer, called "free layer" whereof the magnetization direction is variable, and consists of at least one layer made from a ferromagnetic material having an in-plane magnetization of the layer, magnetically coupled by exchange with a pinning layer made from an antiferromagnetic material and consisting of the layer separating the two magnetic tunnel junctions;
   an insulating layer inserted between the reference layer and the storage layer, constituting the tunnel barrier of the magnetic tunnel junction concerned;
wherein the blocking temperature of the layer made from antiferromagnetic material separating the storage layers is lower than the blocking temperature of the reference layer of the corresponding magnetic tunnel junction;
wherein the product RA resistance×area of the two tunnel barriers is different;
wherein each memory point comprises means for heating the storage layers to a temperature above the blocking temperature of said layers;
wherein the memory comprises means for applying a magnetic field for orienting the magnetization of the storage layer or layers of each memory point with regard to the magnetization of the reference layer or layers without changing the orientation of the reference layers concerned; and
wherein that the storage layers are coupled magnetostatically across the layer made from antiferromagnetic material separating said storage layers, so that the magnetizations of said layers are placed in an antiparallel configuration when the temperature in the magnetic tunnel junction concerned exceeds the blocking temperature of said layer of antiferromagnetic material and in the absence of a magnetic field applied to said memory, or under the influence of a magnetic field of lower intensity than the magnetostatic coupling between said storage layers.

2. The thermally assisted magnetic write memory as claimed in claim 1, wherein the product Resistance×Area of one of the two tunnel barriers is substantially equal to half of the other.

3. The thermally assisted magnetic write memory as claimed in claim 1, wherein the means for varying the orientation of the magnetic field of the storage layers consist of a single conductive line located above or below the magnetic memory point concerned.

4. The thermally assisted magnetic write memory as claimed in claim 1, wherein the memory points have an elliptical or circular cross section.

5. The thermally assisted magnetic write memory as claimed in claim 1, wherein the storage layers are made from a material based on an alloy of Fe, Co, Ni (CoFe or NiFe), which can be doped with boron, in particular when the tunnel barriers are made from MgO.

6. The thermally assisted magnetic write memory as claimed in claim 1, wherein the thicknesses of the storage layers are different.

7. The thermally assisted magnetic write memory as claimed in claim 1, wherein the magnetization of each of the storage and reference layers is substantially parallel to the plane of said layers.

8. The thermally assisted magnetic write memory as claimed in claim 1, wherein the antiferromagnetic layers pinning the reference layers are made from a material whereof the blocking temperature is higher than the blocking temperature of the antiferromagnetic layer separating the two magnetic tunnel junctions.

9. The thermally assisted magnetic write memory as claimed in claim 8, wherein the antiferromagnetic layers pinning the reference layers are made from a material whereof the blocking temperature is higher than 250° C., and are made in particular from PtMn.

10. The thermally assisted magnetic write memory as claimed in claim 8, wherein the blocking temperature of the antiferromagnetic layer separating the two magnetic tunnel junctions is lower than 200° C., said layer being made on the basis of a manganese rich alloy, and in particular from IrMn or FeMn.

11. The thermally assisted magnetic write memory as claimed in claim 9, wherein the blocking temperature of the antiferromagnetic layer separating the two magnetic tunnel junctions is lower than 200° C., said layer being made on the basis of a manganese rich alloy, and in particular from IrMn or FeMn.

12. The thermally assisted magnetic write memory as claimed in claim 1, wherein each of the reference layers consists of a multilayer comprising two magnetic layers and an intermediate layer selected from a material that comprises ruthenium, the two magnetic layers located on either side of this intermediate layer being antiferromagnetically coupled by this said intermediate layer.

13. A method for effecting the writing of memory points of a magnetic memory consisting of memory points or memory cells, each of which consists of a double magnetic tunnel junction separated from one another by a layer made from an antiferromagnetic material, and whereof the stacking order of the layers constituting them is reversed with regard to one another, wherein each write phase is accompanied by an increase in temperature of the memory point concerned by the sending of a current pulse into a conductive line or bit line associated with the memory point concerned, and wherein the actual writing takes place in three phases:
   heating of the memory point by circulating a current in the conductive line (bit line) and then through the tunnel junction concerned to raise the temperature above the blocking temperature of the antiferromagnetic layer separating the two storage layers;

transmission of a current pulse into a conductive line (digit line), to obtain the alignment of the magnetizations of the storage layers parallel or antiparallel to the alignment of the magnetizations of the reference layers in contact with the tunnel barriers;

definition of the states of the memory point during cooling:
  interruption of the heating current before the end of the current pulse in the digit line: definition of the states "00" and "11" according to the polarity of the current passing through the digit line;
  or interruption of the heating current after the end of the current pulse in the digit line: creation of a magnetostatic coupling between the two storage layers, causing the switching of the magnetization of one of said two layers to favor an antiparallel alignment of the magnetizations, and which, according to the polarity of the current in the digit line, defines the states "01" and "10".

14. A method for effecting the writing of memory points of a magnetic memory consisting of memory points or memory cells, each of which consists of a double magnetic tunnel junction separated from one another by a layer made from an antiferromagnetic material, and whereof the stacking order of the layers constituting them is reversed with regard to one another, said memory points being integrated in a matrix architecture, in which each memory point is associated with a switching transistor controlled by an addressing line (word line) for ordering the opening or closing of the channel of said transistors, wherein each write phase is accompanied by an increase in temperature of the memory point concerned by the sending of a current pulse into a conductive line or bit line associated with the memory point concerned, and in that the writing of said memory points takes place in three phases:

a first phase, in which the world line is opened in order to place all the transistors of the column concerned in ON mode;

a second phase, in which a heating current is sent into all the bit lines to permit the writing of all the memory points of the column;

and a third phase, in which a current for generating a positive or negative magnetic field is sent into another current line (digit line) to orient the magnetization of the storage layers parallel or antiparallel to the magnetization of the reference layers in contact with the tunnel barriers;

the writing of the state "00", respectively "11" being carried out by stopping the heating in the memory point concerned by stopping the current in the bit line, said memory point cooling under the action of the positive, respectively negative magnetic field generated by the digit line;

the writing of the state "01", respectively "10" being carried out by stopping or decreasing the positive, respectively negative magnetic field, generated by the digit line before stopping the heating in the memory point concerned, that is, before interrupting the current in the bit line.

15. The method for writing memory points of a magnetic memory as claimed in claim 14, wherein the magnetic field generated by the digit line during the writing of the states "01" and "10" is decreased to a value lower than the magnetostatic coupling field between the two storage layers located on either side of the pinning layer of antiferromagnetic material.

* * * * *